(12) United States Patent
Huang et al.

(10) Patent No.: US 8,129,101 B2
(45) Date of Patent: Mar. 6, 2012

(54) METHOD FOR INCREASING THE REMOVAL RATE OF PHOTORESIST LAYER

(76) Inventors: Wen-Hsien Huang, Tainan County (TW); Min-Chieh Yang, Kaohsiung (TW); Jiunn-Hsing Liao, Tainan County (TW)

( * ) Notice: Subject to any disclaimer, the term of this patent is extended or adjusted under 35 U.S.C. 154(b) by 437 days.

(21) Appl. No.: 12/399,019

(22) Filed: Mar. 6, 2009

(65) Prior Publication Data

US 2009/0169767 A1 Jul. 2, 2009

Related U.S. Application Data

(62) Division of application No. 11/163,469, filed on Oct. 20, 2005, now Pat. No. 7,531,434.

(51) Int. Cl.
*G03F 7/26* (2006.01)

(52) U.S. Cl. .......................... 430/327; 430/322
(58) Field of Classification Search .................. 430/311, 430/327
See application file for complete search history.

(56) References Cited

U.S. PATENT DOCUMENTS

| | | | |
|---|---|---|---|
| 6,720,247 B2 | 4/2004 | Kirkpatrick et al. | |
| 7,488,650 B2 * | 2/2009 | Schulz | 438/268 |
| 2002/0111017 A1 * | 8/2002 | Kirkpatrick et al. | 438/638 |
| 2003/0059688 A1 * | 3/2003 | Inomata et al. | 430/5 |

* cited by examiner

*Primary Examiner* — Kathleen Duda
(74) *Attorney, Agent, or Firm* — Chun-Ming Shih

(57) ABSTRACT

A method for increasing the removal rate of a photoresist layer is provided. The method includes performing a pre-treatment of a substrate, such as a plasma process, before forming the photoresist layer. The method can be applied to the fabrication of semiconductor devices for increasing the removal rate of the photoresist layer.

14 Claims, 4 Drawing Sheets

METHOD FOR INCREASING THE REMOVAL RATE OF PHOTORESIST LAYER

CROSS-REFERENCE TO RELATED APPLICATION

This application is a divisional application of and claims priority benefit of an application Ser. No. 11/163,469, filed Oct. 20, 2005. The entirety of the above-mentioned patent application is hereby incorporated by reference herein and made a part of this specification.

BACKGROUND OF THE INVENTION

1. Field of the Invention

The present invention relates to a method of fabricating semiconductor devices. More particularly, the present invention relates to a method of fabricating semiconductor devices that can increase the efficiency of removing photoresist.

2. Description of the Related Art

Photolithography is one of the critical process for fabricating integrated circuits. The photoresist layer used in a photolithographic process must be completely removed after a dry etching operation, a wet etching operation or an ion implant process to prevent any residues from affecting subsequent processing operations.

However, property of photoresist varies with processing environment. For example, in an ion implant process, the surface of a photoresist layer will be hardened by the ions so that the gas trapped in the photoresist during photolithographic process is hardly to come out. In the later ashing process, the gas exposes and cause pollution of the wafer (popping). Moreover, after the ion implant process, an ashing treatment with $CF_4$ and an clean process using high-temperature RCA solution (developed by Kern and Puotinen in the experimental laboratory set up by the Radio Corporation of America (RCA) in 1960) with dilute hydrofluoric acid (DHF), and now a commonly used wet cleaning solution) are performed to remove the surface-hardened photoresist. However, because the photoresist is removed using an RCA solution with DHF raised to a high temperature, upward of about 70° C., the process of removing the photoresist will lead to a wasting of some oxide material on the substrate. Ultimately, the performance of the device may be affected.

To prevent the effect a high-temperature RCA solution on the performance of a device, a low temperature RCA solution without DHF is widely adopted to remove photoresist material after an ion implant process. Yet, the efficiency or removal rate of photoresist material using a low temperature RCA solution is rather low. Moreover, it is difficult to remove the photoresist material completely. Thus, the process for removing photoresist material after an ion implant process needs to improve.

SUMMARY OF THE INVENTION

Accordingly, the present invention is to provide a method of removing photoresist layer that can increase the efficiency of removing photoresist material after an ion implant process.

The present invention also provides a method for increasing the removal rate of a photoresist layer. The method includes providing a substrate and performing a pre-treatment process on the substrate before forming a photoresist layer.

According to an embodiment of the present invention, the pre-treatment includes a plasma treatment, for example. The gas used in the plasma process is selected from the group consisting of hydrogen, oxygen, nitrogen, nitrous oxide, water or their combination. The plasma process is carried out at a temperature between 100° C. to 260° C.

According to an embodiment of the present invention, the method further comprises performing a cleaning operation before the photoresist layer is formed. The cleaning operation is performed using a solution mixture without dilute hydrofluoric acid. The solution mixture contains ammonium hydroxide, hydrogen peroxide and de-ionized water.

According to an embodiment of the present invention, the pre-treatment process is performed after the cleaning operation is conducted.

According to an embodiment of the present invention, the method further comprises, after the photoresist layer is formed, performing an ion implant process using the photoresist layer as a mask to form a doped region in the substrate and removing the photoresist layer.

According to an embodiment of the present invention, the step of removing the photoresist layer comprises an ashing process and a cleaning process using at least a cleaning solution. The ashing process without using $CF_4$ and the cleaning solution without dilute hydrofluoric acid.

According to an embodiment of the present invention, the cleaning process includes using a first solution mixture first and then using a second a solution mixture. The first solution mixture contains ammonium hydroxide, hydrogen peroxide and de-ionized water, and the second solution mixture contains hydrochloric acid, hydrogen peroxide and de-ionized water.

According to an embodiment of the present invention, the pre-treatment process is performed to form a buffer layer over the substrate.

According to an embodiment of the present invention, the substrate includes a structural component having logic devices or memory devices thereon.

In the present invention, a pre-treatment of the surface of a substrate is carried out before forming the photoresist layer that serves as an ion implant mask. The pre-treatment process can increase the efficiency of removing photoresist material in a subsequent process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
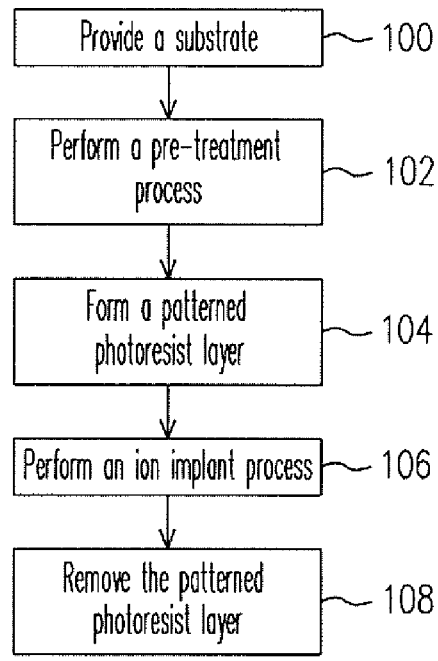
FIG. 1 is a flow diagram showing the steps for fabricating a semiconductor device according to the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flow diagram showing the steps for fabricating a semiconductor device according to the present invention. As shown in FIG. 1, a substrate is provided in step 100. The substrate can be a silicon substrate or a structural component having logic devices or memory devices such as a gate, a gate oxide layer or all kinds of lightly doped regions disposed thereon.

In step 102, a pre-treatment for the substrate is carried out. The pre-treatment is a plasma treatment, for example. The gas used in the plasma treatment is selected from the group consisting of hydrogen, oxygen, nitrogen, nitrous oxide, water and their combination. The plasma treatment is performed at a temperature between 100° C. to 260° C. The plasma treatment can produce a buffer layer over the substrate so that the substrate is isolated from a subsequently formed photoresist layer and the efficiency of removing the photoresist material is substantially increased.

In step 104, a patterned photoresist layer is formed over the substrate. Then, in step 106, using the patterned photoresist layer as a mask, an ion implant process is carried out to form a doped region in the substrate. The doped region is a source/drain region, for example. In the presence of the buffer layer, the gas in the photoresist layer can be channeled out through the buffer layer instead of being trapped during ashing process. Hence, popping resulting from trapped gas can be avoided.

In step 108, the patterned photoresist layer is removed. The method of removing the patterned photoresist layer includes performing an ashing process using oxygen plasma without $CF_4$ and cleaning with an RCA solution without DHF thereafter. The process of cleaning the substrate with an RCA solution without DHF after performing the ashing process includes a two-step process, for example. First, a first cleaning operation with a solution mixture containing ammonia, hydrogen peroxide and de-ionized water heated to a temperature between 20° C. to 30° C. is carried out. This is followed by a second cleaning operation with a solution mixture containing hydrochloric acid, hydrogen peroxide and de-ionized water heated to a temperature between 20° C. to 30° C.

In the present invention, a pre-treatment is carried out before forming the patterned photoresist layer. This prevents popping from ashing process after the ion implant process and increases the process window and efficiency in removing the patterned photoresist layer.

Figure 2A:
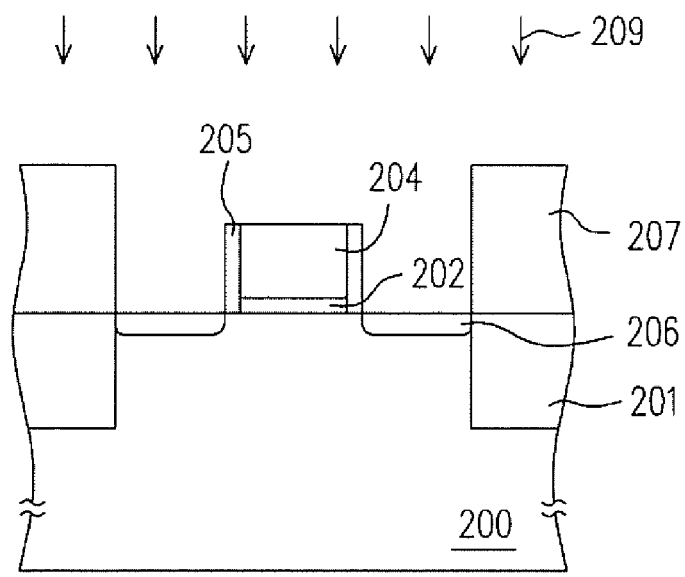
FIGS. 2A through 2C are schematic cross-sectional views showing the steps for fabricating a semiconductor device according to the present invention.
Figure 2B:
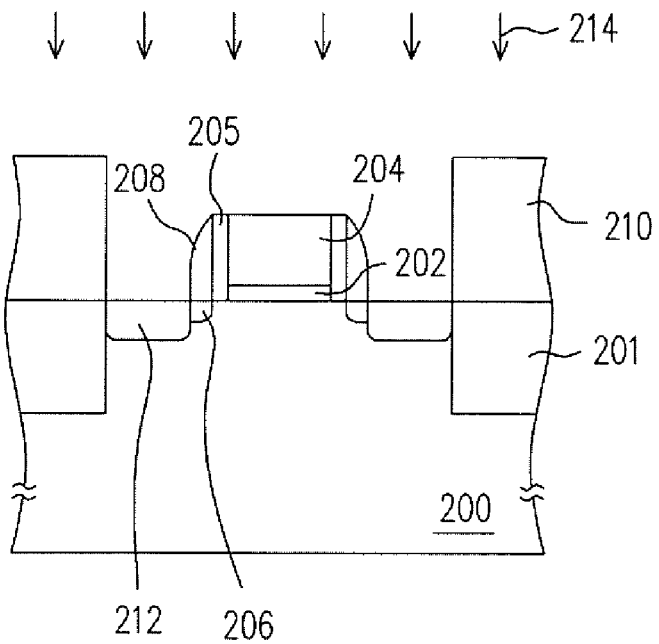
Figure 2C:
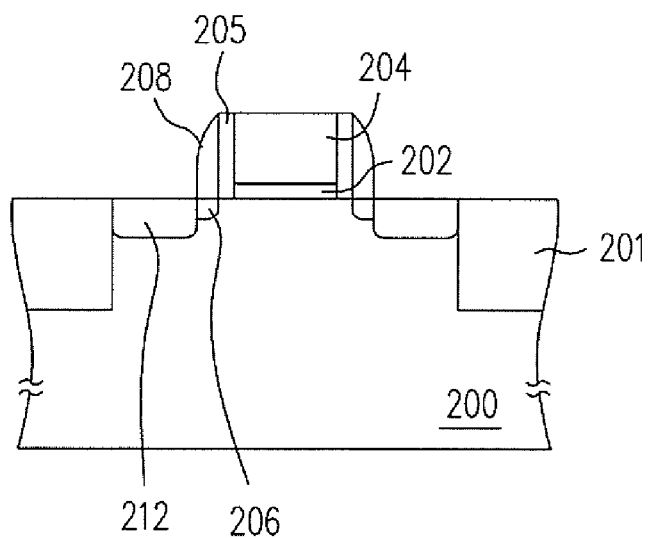

FIGS. 2A through 2C are schematic cross-sectional views showing the steps for fabricating a semiconductor device according to the present invention. The semiconductor device is a MOS device, for example. As shown in FIG. 2A, a substrate 200 having isolation structures 201 formed thereon is provided. Then, a gate oxide layer 202 and a gate 204 are formed over the substrate 200. The gate oxide layer 220 is a silicon oxide formed by performing a thermal oxidation process, for example. The gate 204 is a polysilicon layer formed, for example, by performing a low-pressure chemical vapor deposition (LPCVD) process, for example. Thereafter, off-set spacers 205 are formed on the respective sidewalls of the gate 204. The off-set spacers 205 are formed, for example, by performing a chemical vapor deposition process to form a dielectric layer over the substrate 200 and performing an anisotropic etching process to etch back the dielectric layer. After that, a high-temperature thin oxide annealing treatment is carried out to eliminate the crystalline defects formed in the gate 204 and on the surface of the substrate 200. Then, a pair of lightly doped source/drain regions 206 is formed in the substrate 200. The lightly doped source/drain regions 206 is an N-type lightly doped region or P-type lightly doped region formed, for example, by performing an ion implant process 209 using a patterned photoresist layer 207 as a mask.

Thereafter, the patterned photoresist layer 207 is removed. The method of removing the patterned photoresist layer 207 includes, for example, removing most of the patterned photoresist layer 207 with oxygen plasma and then removing the remaining patterned photoresist layer 207 using a low temperature RCA cleaning process. The low temperature RCA cleaning process includes performing a cleaning operation using a solution mixture containing ammonium hydroxide, hydrogen peroxide and de-ionized water at a temperature between 20° C. to 30° C. Then, another cleaning operation is performed using a solution mixture containing hydrochloric acid, hydrogen peroxide and de-ionized water at a temperature between 20° C. to 30° C.

As shown in FIG. 2B, spacers 208 are formed on the respective sidewalls of the gate 204. The spacers 208 are formed by depositing silicon oxide or silicon nitride to form a silicon oxide or a silicon nitride layer or depositing silicon oxide and silicon nitride in sequence to form an oxide/nitride composite layer. Then, an anisotropic etching process is carried out until the gate 204 and a portion of the substrate 200 is exposed. The anisotropic etching process will result in the production of some polymer. Thereafter, a cleaning operation is carried out to remove the polymer formed in the process of forming the spacers 208. The cleaning operation is a cleaning process using an RCA solution without DHF, for example. The RCA cleaning operation includes performing a cleaning operation using a solution mixture containing ammonium hydroxide, hydrogen peroxide and de-ionized water at a temperature between 70° C. to 80° C. Then, another cleaning operation is performed using a solution mixture containing hydrochloric acid, hydrogen peroxide and de-ionized water at a temperature between 70° C. to 80° C.

After that, a pre-treatment is performed on the exposed gate 204, the spacers 208 and the substrate 200. The pre-treatment is a plasma process, for example. The gas used in the plasma process is selected from the group consisting of hydrogen, oxygen, nitrogen, nitrous oxide, water and their combination. The pre-treatment is carried out at a temperature between 100° C. to 260° C. After performing the plasma process, an invisible buffer layer (not shown) is formed on the substrate 200. Hence, the substrate 200 and a subsequently formed photoresist layer are isolated so that the efficiency of removing the photoresist layer can be increased.

Thereafter, a patterned photoresist layer 210 is formed over the substrate 200. The patterned photoresist layer 210 exposes the gate 204, the lightly doped source/drain regions 206 and the spacers 208. Then, using the patterned photoresist layer 210, the gate 204 and the spacers 208 as a mask, a pair of source/drain regions 212 is formed in the substrate 200. The source/drain regions 212 are N-type heavily doped regions or P-type heavily doped regions formed, for example, by performing an ion implant process 214.

The photoresist layer 210 is removed, for example, by applying oxygen plasma and then performing a low temperature RCA cleaning process to form the MOS device structure as shown in FIG. 2C. The low temperature RCA cleaning process is identical to the aforementioned low temperature RCA cleaning process so that a detailed description is omitted.

Figure 3:
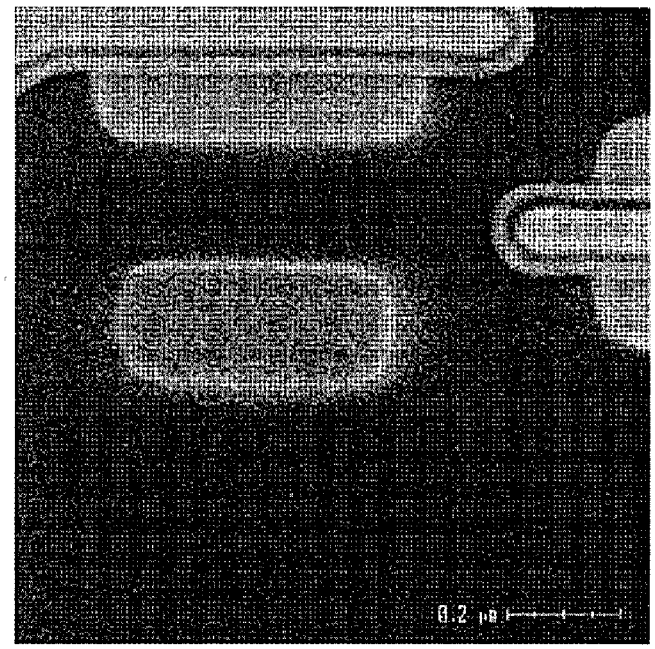
FIG. 3 is a photo showing an example of the application of the pre-treatment process according to the present invention.

As a first example, a shallow trench isolation (STI) structure is formed on a substrate. Then, a get oxide, gate and spacers are formed on the substrate. The height and depth of the STI structure on the substrate and the thickness of the spacers are measured. Thereafter, a pre-treatment process is carried out using hydrogen and nitrogen plasma at a temperature between 100° C. to 260° C. After that, the remained oxide above the substrate and depth of the STI structure on the substrate and the thickness of the spacers are again measured. The results are listed in Table 1. Then, a patterned photoresist layer is formed. Using the patterned photoresist layer as a mask, an ion implant process is performed to form doped regions in the substrate. Then, the substrate is cleaned using an ashing without $CF_4$ and an RCA without DHF cleaning solution at room temperature to remove the patterned photoresist layer. A photo of the resulting substrate is shown in FIG. 3.

Figure 4:
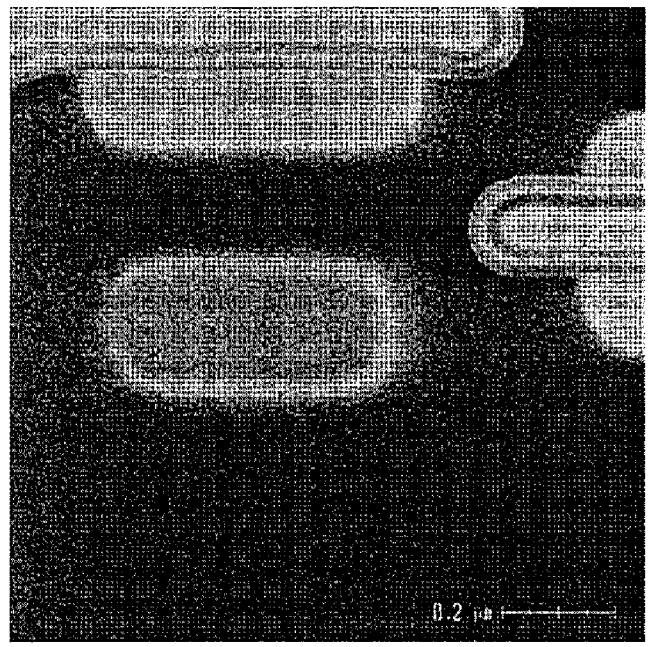
FIG. 4 is a photo showing another example of the application of the pre-treatment process according to the present invention.

In a second example, the method is identical to the first example except that the pre-treatment is carried out using oxygen plasma at a temperature between 100° C. to 260° C. The results are also listed in Table 1 and a photo of the resulting substrate is shown in FIG. 4.

TABLE 1

| | Example 1 | | Example 2 | |
| --- | --- | --- | --- | --- |
| | Before pre-treatment | After pre-treatment | Before pre-treatment | After pre-treatment |
| Remained oxide above the substrate | 28.09 Å | 28.38 Å | 26.56 Å | 25.36 Å |
| Depth of the STI | 3566.4 Å | 3560.2 Å | 3515.7 Å | 3519.3 Å |
| Width of the spacers | 0.17941 μm | 0.17968 μm | 0.18528 μm | 0.18483 μm |

According to the results shown in Table 1, the difference between the values measured before and after the pre-treatment process is within the tolerance range. This indicates that the pre-treatment process will not affect the dimension of various components on the surface of the MOS transistor. Furthermore, no photoresist residues can be seen in the FIGS. 3 and 4 after deploying the method of the present invention.

Figure 5:
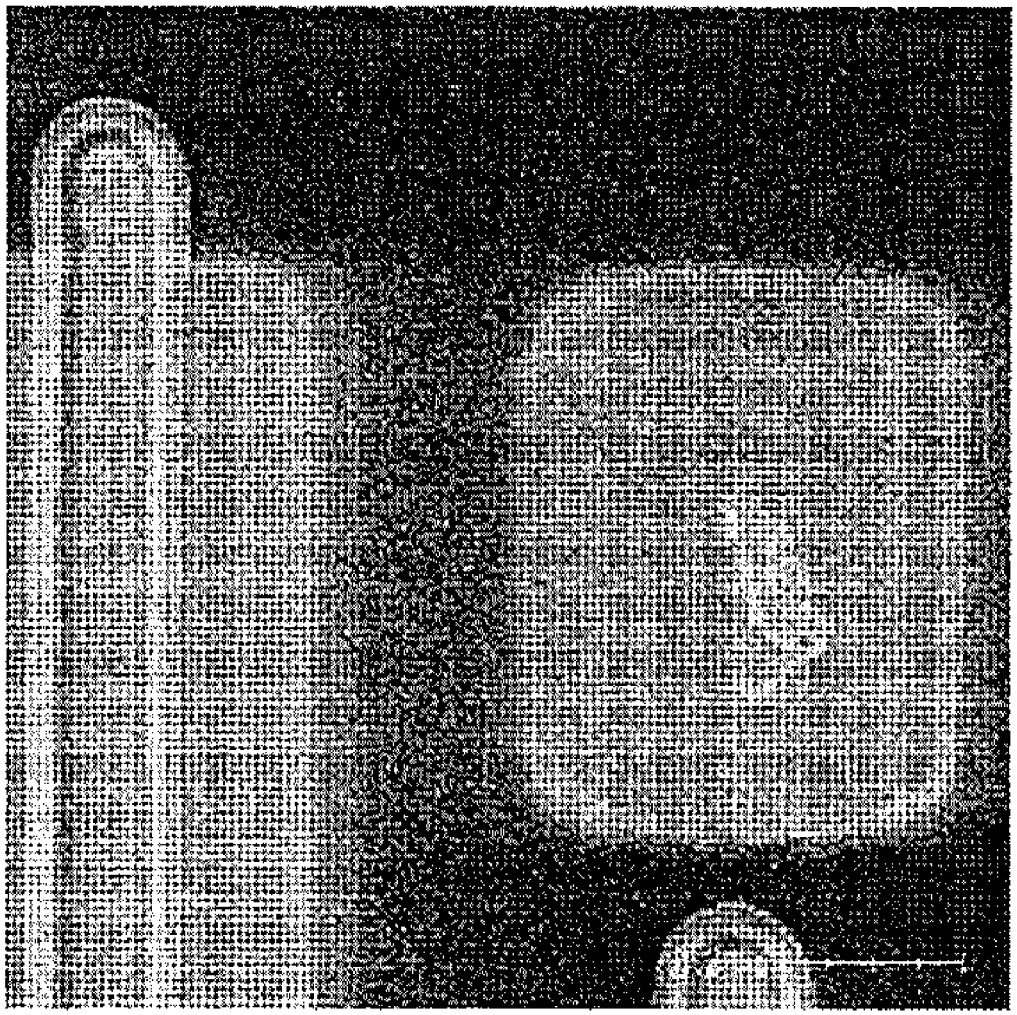
FIG. 5 is a photo showing a comparison example without performing a pre-treatment process.

In a comparison example 1, a method identical to the first example is used except that the ion implant process is carried out without performing the pre-treatment described in the present invention. A photo of the substrate is shown in FIG. 5. As recognized in the photo, some photoresist residues can be seen in the doped region.

According to the first example, the second example and the compare example 1, the method in the present invention not only can remove photoresist residues completely, but can increase the removal rate of the photoresist layer used as an ion implant mask. In addition, the pre-treatment process before forming the patterned photoresist layer permits the removal of photoresist using a low temperature cleaning solution. Moreover, the photoresist material can be completely removed within a shorter period of time so that the process window is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for increasing the removal rate of a photoresist layer, comprising:
providing a substrate; and
performing a plasma treatment to the substrate before forming a photoresist layer, wherein a gas used for performing the plasma treatment is selected from the group consisting of oxygen, nitrous oxide and combination thereof.

2. The method of claim 1, wherein the plasma treatment is performed at a temperature between 100° C. to 260° C.

3. The method of claim 1, wherein before forming the photoresist layer, further comprises performing a cleaning operation.

4. The method of claim 3, wherein the cleaning operation is performed using a solution mixture without dilute hydrofluoric acid.

5. The method of claim 4, wherein the solution mixture contains ammonium hydroxide, hydrogen peroxide and de-ionized water.

6. The method of claim 4, wherein the pre-treatment process is performed after the cleaning operation.

7. The method of claim 1, further comprising:
after the photoresist layer is formed, performing an ion implant process using the photoresist layer as a mask to form a doped region in the substrate; and removing the photoresist layer.

8. The method of claim 7, wherein the step of removing the photoresist layer comprises an ashing process and a cleaning process using at least one cleaning solution.

9. The method of claim 8, wherein the ashing process is performed without using CF4.

10. The method of claim 8, wherein the cleaning solution doesn't contain dilute hydrofluoric acid.

11. The method of claim 8, wherein the cleaning process includes using a first solution mixture first and then using a second solution mixture.

12. The method of claim 11, wherein the first solution mixture contains ammonium hydroxide, hydrogen peroxide and de-ionized water, and the second solution mixture contains hydrochloric acid, hydrogen peroxide and de-ionized water.

13. The method of claim 1, wherein the plasma treatment is performed to form a buffer layer over the substrate.

14. The method of claim 1, wherein the substrate includes a structural component having logic devices or memory devices thereon.

* * * * *